United States Patent [19]

Sakakima et al.

[11] Patent Number: 5,459,687
[45] Date of Patent: Oct. 17, 1995

[54] MEMORY ELEMENT

[75] Inventors: Hiroshi Sakakima, Tsuzuki; Mitsuo Satomi, Katano; Yousuke Irie, Kadoma, all of Japan

[73] Assignee: Matsushita Electric Industrial Co., Ltd., Osaka, Japan

[21] Appl. No.: 144,593

[22] Filed: Oct. 28, 1993

[30] Foreign Application Priority Data

Feb. 18, 1993 [JP] Japan ................... 5-028748

[51] Int. Cl.$^6$ ................................. G11C 11/15
[52] U.S. Cl. ................ 365/158; 365/171; 365/173; 360/113; 360/119
[58] Field of Search ................... 365/158, 171, 365/173; 360/113, 119

[56] References Cited

U.S. PATENT DOCUMENTS

| | | | |
|---|---|---|---|
| 3,495,224 | 2/1970 | Raffel | 340/174 |
| 3,531,780 | 9/1970 | Huijer | 340/174 |
| 3,996,575 | 12/1976 | Battarel | 365/158 X |
| 4,857,418 | 8/1989 | Schuetz | 365/158 X |
| 5,173,873 | 12/1992 | Wu et al. | 365/158 X |

FOREIGN PATENT DOCUMENTS 0506433  9/1992  European Pat. Off. .

OTHER PUBLICATIONS

M. N. Baibich et al.; "Giant Magnetoresistance of (001)Fe/(001)Cr Magnetic Superlattices"; Physical Review Letters, vol. 61, No. 21, pp. 2472–2474; ©1988 The American Physical Society.

S. S. P. Parkin et al.; "Oscillations in Exchange Coupling and Magnetoresistance in Metallic Superlattices Structures: Co/Ru, Co/Cr, and Fe/Cr"; Physical Review Letters, vol. 64, No. 19, pp. 2304–2307; ©1990 The American Physical Society.

Teruya Shinjo et al.; "Large Magnetoresistance of Field–Induced Giant Ferrimagnetic Multilayers"; Journal of The Physical Society of Japan, vol. 59, No. 9; Sep., 1990; pp. 3061–3064.

Hiroshi Sakakima et al.; "Low–Field Giant Magnetoresistance in [Ni–Fe–Co/Cu/Co/Cu] Superlattices"; Jpn. J. Appln. Phys. vol. 31 (1992); pp. L484–L486, Part 2, No. 4B, 15 Apr. 1992 (corresponding sustantially to The Institute of Electronics, Information and Communication Engineers, Technical Research Report, MR91–9 in the Specification, p. 2, lines 10–12).

Primary Examiner—Do Hyun Yoo
Attorney, Agent, or Firm—Panitch Schwarze Jacobs & Nadel

[57] ABSTRACT

A high performance thin film memory device uses an artificial lattice magnetoresistance effect film, and operable with a low magnetic field and room temperature; and the device has a magnetic film part M, current feed lines R and R' for generating magnetic field for information data writing-in, and an information data readout line S of an artificial lattice magnetoresistance film of a lamination structure of a metallic magnetic thin layers such as Ni—Fe—Co system and a metallic nonmagnetic thin layers such as Cu.

11 Claims, 3 Drawing Sheets

MEMORY ELEMENT

FIELD OF THE INVENTION AND RELATED ART STATEMENT

1. Field of the Invention

The present invention relates to a memory element using an artificial lattice magnetoresistance film.

2. Description of the Related Art

Heretofore, developments of magnetoresistance sensors (hereinafter, called as MR sensor) and magnetoresistance heads (hereinafter, called as MR head) have been pursued. As the magnetic materials, mainly permalloy such as $Ni_{0.8}Fe_{0.2}$ and the likes have been used. In case of using these materials, magnetoresistance variation ratio, MR ratio (hereinafter often denoted as $\Delta R/R$), is about 2.5%. Then, in order to obtain a magnetoresistance material of higher sensitivity, materials having larger values of $\Delta R/R$ are tried to be sought. In recent years, it has been found that giant magnetoresistance effects are obtainable in antiferromagnetically coupled [Fe/Cr] or [Co/Ru] artificial lattice films (Physical Review Letters, vol.61, p.2472, 1988; ditto, vol.64, p.2304, 1990). And the giant magnetoresistance effect was also found in [Ni—Fe/Cu/Co] artificial lattice film using a magnetic thin film Ni—Fe and Co which were separated by a metallic nonmagnetic thin film Cu and were not magnetically coupled, and one having a $\Delta R/R$ of 10% under an applied magnetic field of 3 kOe at room temperature was obtained (Journal of Physical Society of Japan vol.59, p.3061, 1990). Furthermore, the giant magnetoresistance effect was also found in [Ni—Fe—Co/Cu/Co] or [Ni—Fe—Co/Cu] artificial lattice film using a magnetic thin film of Ni—Fe—Co or of Co which was coupled antiferromagnetically through a metallic nonmagnetic thin film Cu. And one having a $\Delta R/R$ of 10% under an applied magnetic field of 3 kOe at room temperature was obtained (The Institute of Electronics, Information and Communication Engineers, Technical Research Report, MR91-9). However, as for the application of these metallic artificial lattice films, heretofore, only magnetic sensors and magnetic heads were pursued.

OBJECT AND SUMMARY OF THE INVENTION

Object of the present invention is to constitute a magnetic thin film memory element using an artificial lattice magnetoresistance effect film as described above for the information data readout. When the above-mentioned metallic artificial lattice film is used for the purpose of the information data readout, if we intend to obtain such a large $\Delta R/R$ effect by [Fe/Cr] or [Co/Ru], a large applied magnetic field is required. Therefore, it is not suited to actual applications. Although the use of conventional magnetoresistance materials such as $Ni_{0.8}Fe_{0.2}$ can make the operation under a low magnetic field, there is a drawback that the obtainable $\Delta R/R$ effect is small.

The present invention provides a memory element by an efficient utilization of characteristics of a certain kind of metallic artificial lattice film and the use thereof.

The memory element in accordance with the present invention comprises:

a magnetic film member M which is formed by a patterning process, read out line S for information data readout which is provided in the vicinity of the magnetic film member M in a manner insulated from the magnetic film member M and made of the artificial lattice magnetoresistance effect film, and a first current feed line R and a second current line R' which are arranged with right angle to and in parallelism with the read out line S, insulated from each other and from respective above-mentioned members by insulation layers and are for performing the data writing-in action of the memory element by impressing the magnetic field on the above-mentioned magnetic film member M by feeding a first current in the first current feed line R and a second current in the second current feed line R', the read out line S of artificial lattice magnetoresistance effect film having a structure of an alternate lamination of the metallic magnetic layers (P) of a thickness of 5–50Å and the metallic nonmagnetic layers (Q) of a thickness of 5–50Å.

Another best mode of the memory element in accordance with the present invention comprises:

a magnetic film member M which is formed by a patterning process, read out line S for information data readout which is provided in the vicinity of the magnetic film member M in a manner insulated from the magnetic film member M and made of the artificial lattice magnetoresistance effect film, and a first current feed line R and a second current line R' which are arranged with right angle to and in parallelism with the read out line S, insulated from each other and from respective above-mentioned members by insulation layers and are for performing the data writing-in action of the memory element by impressing the magnetic field on the above-mentioned magnetic film member M by feeding a first current in the first current feed line R and a second current feed line R', the read out line S of artificial lattice magnetoresistance effect film having a structure of an alternate lamination of a first metallic magnetic layer (P) of a thickness of 5–50Å and a second metallic magnetic layer P' of a thickness of 5–50Å and a metallic nonmagnetic layers (Q) of a thickness of 5–50Å, in a manner to intermediating the metallic nonmagnetic layers (Q) therebetween, where the first metallic magnetic layers (P) include $(Ni_xCo_{1-x})_{x'}Fe_{1-x'}$, $(0.6 \leq x \leq 1.0, 0.7 \leq x' \leq 1.0)$ as their main composition, the second metallic magnetic layers (P') include $(Co_yNi_{1-y})_zFe_{1-z}$ $(0.4 \leq y \leq 1.0, 0.8 \leq z \leq 1.0)$ as their main composition respectively, and the metallic nonmagnetic layers (Q) include either one of Cu, Ag, or Au as their main composition.

The inventor noticed in that artificial lattice films of a group of [Ni—Fe(—Co)/Cu/Co] or [Ni—Fe—Co/Cu] or [Co—Fe/Cu] system can work under a relatively low applied magnetic field, and that they exhibit a large MR ratio ($\Delta R/R$). And such a memory element is configured as shown in FIG. 1, which comprises the above-mentioned artificial lattice film member S and a magnetic thin film member M and conductor members R and R' for feeding current for magnetic field application. In FIG. 1, a patterning-processed magnetic film member M, a current feed member S for metallic artificial lattice magnetoresistance effect film and current feeding conductors R and R' of magnetic field application for information writing-in action are provided being insulated by respective insulating films (not shown) thereon. Information data are written into the magnetic film member M by a composite magnetic field generated by the current flowing through lines R and R'. And reading-out of the recorded information data is achieved by resistance change of the current feed line S composed of an artificial lattice magnetoresistance effect film. In particular, as for this artificial lattice magnetoresistance effect film the following one is usable.

A structure composed of an alternate lamination of magnetic thin layers (P) of a thickness of 5 to 50Å and metallic nonmagnetic thin layers (Q) of a thickness of 5 to 30Å.

The main composition of the magnetic thin layer (P) is given by $$(Ni_xCo_{1-x})_{x'}Fe_{1-x'} \quad (1)$$

where x and x' are respectively composition ratios taking the following values;

The metallic nonmagnetic thin layer (Q) is either one of Cu, Ag, or Au, and more favorably Cu.

As other mode than the above, the following one is usable:

A structure composed of an alternate lamination of magnetic thin layers (P') of a thickness of 5 to 50Å and the metallic nonmagnetic thin layers (Q) of a thickness of 5 to 50Å.

The main composition of the magnetic thin layer (P') is given by $$(Co_yNi_{1-y})_zFe_{1-z} \quad (1')$$

where y and z are respectively composition ratios taking the following values;

The metallic nonmagnetic thin layers (Q) are either one of Cu, Ag, or Au, and more favorably Cu.

Furthermore, as other mode than the above, the following one is usable:

A structure composed of alternate lamination of the magnetic thin layers (P) of a thickness of 5 to 50Å and the magnetic thin layers (P') of a thickness of 5 to 50Å with metallic nonmagnetic thin layers (Q) provided between those respective laminated magnetic thin layers.

In case where the thickness of the metallic nonmagnetic thin layers (Q) is sufficiently thin, the magnetic thin layers couple magnetically to each other through the metallic nonmagnetic film layers (Q). In case where this magnetic coupling is of a sort which is so-called RKKY (which Refers to Ruderman-Kittel-Kasuya-Yoshida, Y.Yafet, Jour. of Appl. Phys., col.61, p.4058 (1987)), the magnetic thin layers couple in an antiferromagnetic manner, when the thickness of the metallic nonmagnetic thin layers (Q) takes a certain value. When they couple antiferromagnetically, the spin scattering of the conduction band electrons becomes large, and the artificial lattice film exhibits a large magnetoresistance. When a sufficient magnetic field is applied thereon, spins of the magnetic thin layers are arranged in the direction of applied field, and thereby the magnetoresistance exhibits a small value. As the consequence of the above, a large ΔR/R is obtainable.

Even among various artificial lattice films, the conventional ones such as Fe/Cr require an extremely large applied magnetic field, and hence they are not suited for application to the practical device. But, by using the artificial lattice films which are constituted by nonmagnetic layers (Q) and the above-mentioned layers (P) or (P') or combinations of layers (P) and (P'), the device of the present invention can provide a large MR ratio under a low applied magnetic field.

Although the layer (P') requires a slightly larger applied magnetic field than the later (P), it can provide a larger MR ratio. On the other hand, although the MR ratio value of the layer (P) is slightly less than that of (P'), it can be operated under a very small applied magnetic field. Thus those ones of certain combinations thereof can provide intermediate characteristics.

The memory element of the present invention takes a configuration as shown in FIG.1 as mentioned before. When currents are fed to the current feed lines R and R' for magnetic field application for information data writing-in, which feed lines are arranged in a manner of mutually crossing at right angle and provided with insulating films around them and over the magnetic thin film member M, the magnetic thin film member M is magnetized by a composite magnetic field produced by those currents. By changing the direction of currents flowing in R and R', the magnetized direction is changed, and thereby the information data of "1" or "0" are written in to be memorized. Then, by letting pulsed current flow only in the above-mentioned line R, a rotation of the magnetization in the magnetic thin film M takes place, and thereby, depending on the magnetization state of "1" or "0" of the magnetic film member M, resistance variations takes place in the recorded information data readout member S, which is the above-mentioned artificial lattice film. Thus, the information data can be read out.

In accordance with the above-described constitution, by utilizing the characteristics of a particular metallic artificial lattice magnetoresistance film, a magnetic thin film memory is realized, which is drivable by a low magnetic field at room temperature becomes possible.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter the present invention is elucidated on preferred embodiment with reference to the accompanying drawing.

Figure 1:
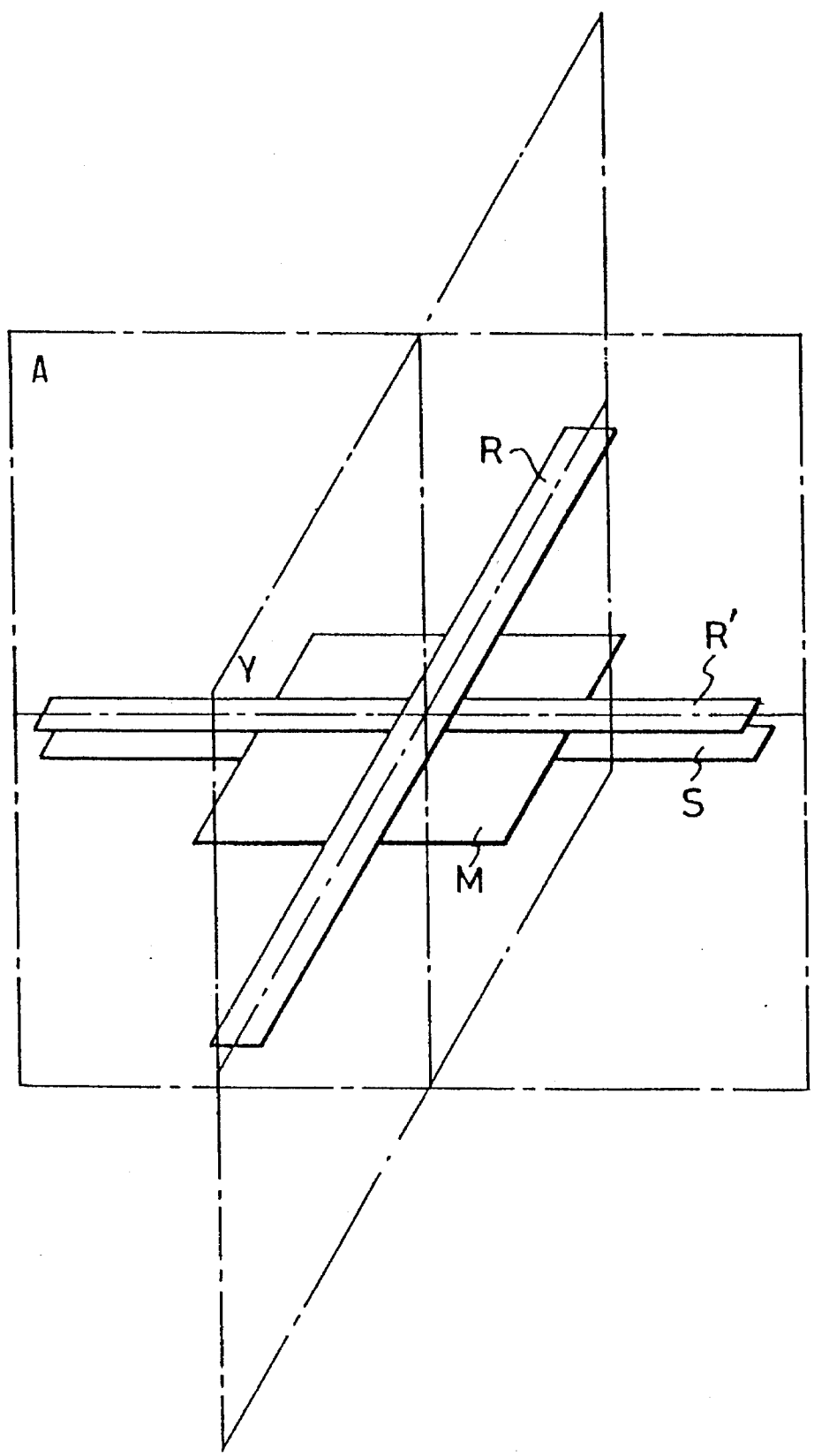
FIG. 1 is a schematic perspective view of an example of the memory element of the present invention with insulation films omitted.

FIG. 1 is a schematic perspective view of an example of the memory element of the present invention, wherein M represents a magnetic film member, S is a reading-out current feed line of metallic artificial lattice magnetoresistance effect film, and R, R' are magnetic field application current feed lines for the information data writing-in action.

Figure 2:
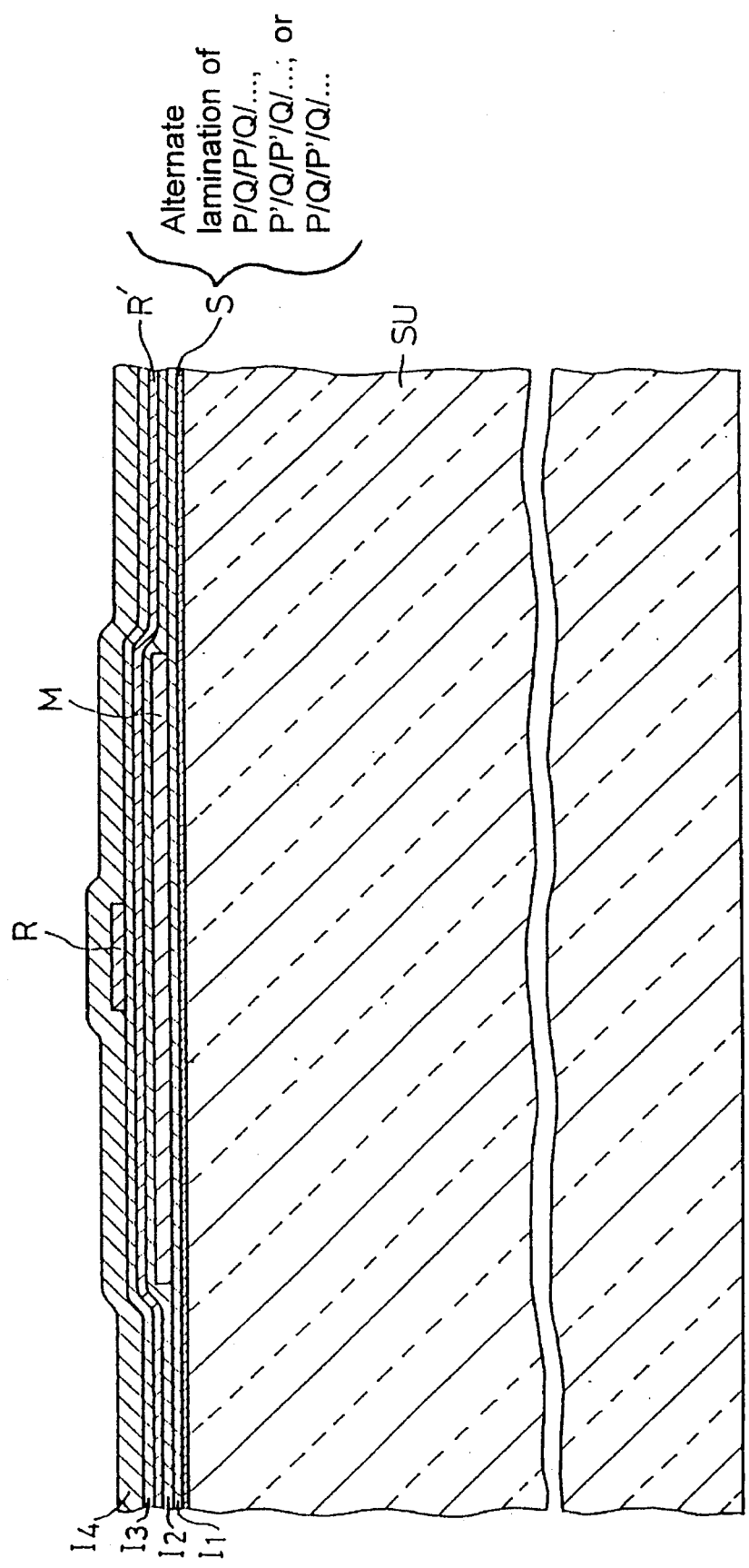
FIG. 2 is a cross-sectional side view of the memory element of the present invention cut along a vertical plane A shown in FIG. 1.

FIG. 2 is a cross-sectional side view of the memory element of the present invention cut along a vertical plane A shown in FIG. 1. R, R', M, and S are all fabricated by evaporation depositions and patterning processes on a substrate SU such as of glass, Si or GaAs. They are mutually separated by thin insulating layers $I_1$, $I_2$ and $I_3$ of $SiO_2$ or SiO, $Si_3N_4$, AlN etc. of several hundreds Å, and further, the top face is protected by a thicker protection layer $I_4$ of similar composition.

Figure 3:
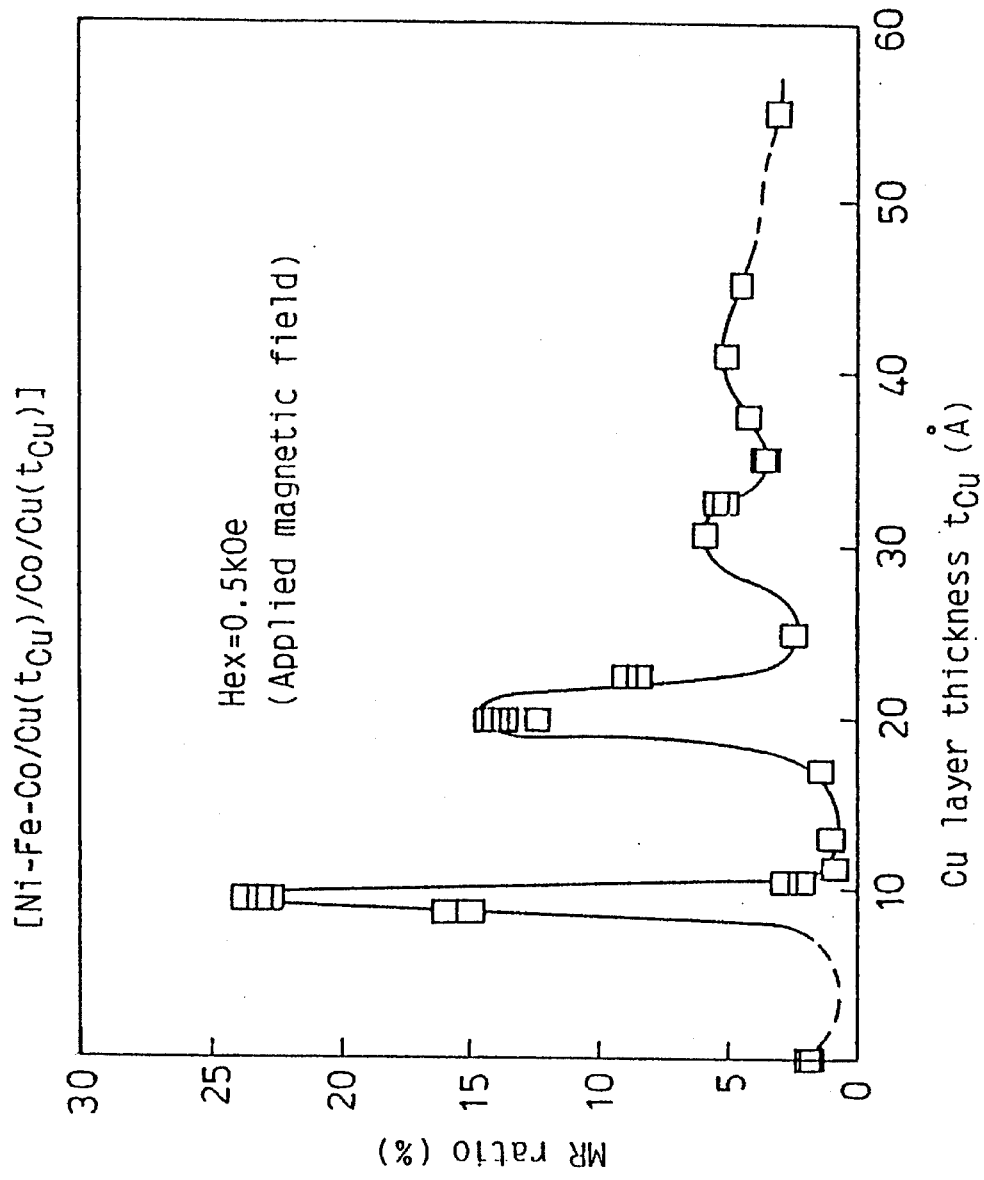
FIG. 3 is a graph showing an example of ΔR/R characteristic of an artificial lattice magnetoresistance effect film ([Ni—Fe—Co(30)/Cu/Co(30)/Cu] artificial lattice film in this figure; numbers in parentheses represent the film thickness in Å).

FIG. 3 is a graph showing an example of ΔR/R characteristic of an artificial lattice magnetoresistance effect film ([Ni—Fe—Co(30)/Cu/Co(30)/Cu] artificial lattice film in this figure, numbers in parentheses represent the film thickness in Å), that is, the dependent characteristic of the MR ratio on the layer thickness $t_{Cu}$ of the metallic nonmagnetic layer (Cu in this case).

It is necessary that the above-mentioned magnetic thin layers (P) and (P') are low magnetostriction films. This is because that, if their magnetostrictions are large, when a film is evaporation-deposited on a substrate or a coating film is deposited on another film, the magnetic characteristic of the deposited film is apt to scatter and also it becomes magnetically hard, and hence a low magnetic field operation becomes difficult.

As for the one fulfilling the above condition, there are a film of Ni-rich Ni—Fe—Co system represented by the afore-mentioned chemical expressions (1) and a film of Co-rich Co—Ni—Fe represented by the afore-mentioned chemical expression (1'). As for the magnetic thin film (P), it is not limited to the ternary compounds as exemplified above, but also binary magnetic thin layers such as Ni—Fe or Ni—Co system can be used as far as they exhibit a soft magnetic character and their ΔR/R is relatively large can also be used. Similarly to the above, concerning the magnetic thin layers (P'), it is not necessarily limited to the ternary compounds, Co or Co—Fe can also be used.

The magnetic thin layer (P) has a small magnetostriction and exhibits a soft magnetic character. Its typical examples are such as $Ni_{0.8}Co_{0.1}Fe_{0.1}$ and $Ni_{0.8}Co_{0.2}$ or the likes. On the other hand, the magnetic thin layer (P') exhibits a relatively small magnetorestriction when it fulfills the condition of the chemical expression (1), and its intrinsic hard magnetic character is softened, and its character becomes a practically usable one. Its typical example is such as $Co_{0.9}Fe_{0.1}$. In these magnetic thin layers, although depending on their compositions, there is a general problem that when their thickness is less than 5Å eventual lowering of the magnetization occurs at the room temperature owing to the lowering of its Curie temperature, and as the thickness of magnetic thin layers of the artificial lattice film exceeds 50Å, the magnetoresistance effect begins to decrease and it drops largely for the thickness of more than 100Å. Therefore, it is necessary to keep the thickness of respective magnetic thin layers to be less than 100Å, desirably to be 50Å. Thus, it is desirable to select the thickness of these magnetic thin layers between 5 and 50Å.

By the one composed of only the magnetic thin layers (P') and the metallic nonmagnetic thin layers (Q), a large ΔR/R is obtainable, but required operation magnetic field is large to a certain extent. By the use of the one composed of the combination of the magnetic thin layers (P') and the magnetic thin layers (P), a larger ΔR/R is obtainable than that obtained by the one composed of only the magnetic thin layers (P) and the metallic nonmagnetic thin layers (Q), and the necessary operation magnetic field can be made to be smaller than that obtainable by the one composed of only the magnetic thin layer (P') and the metallic nonmagnetic thin layers (Q).

As for the metallic thin layers which are to be inserted between the magnetic thin layers (P) (or the magnetic thin layers (P) and (P')), it is necessary to use the one that which is little reactive with the magnetic thin layers (P) (or layers (P) and (P')) of the composition represented by the aforementioned chemical representations (1) and (1') at their interfaces and, in addition, it is necessary that they must be nonmagnetic. For this purpose, elements such as Cu, Ag, and Au are suitable, and at the present state of the art, Cu is most desirable. When the thickness of the metallic nonmagnetic thin layers (Q) becomes more than 50Å, the coupling between the magnetic thin layers (P) (or layers (P) and (P') through the metallic nonmagnetic thin layers (Q) diminishes greatly. And, in the case that the metallic nonmagnetic thin layers (Q) is absent or in the case that the thickness thereof becomes less than 5Å, the magnetic thin layers (P) (or layers (P) and (P')) couple ferromagnetically to each other. Accordingly, in this case, antiferromagnetic coupling state cannot be realized, and hence no large magnetoresistance effect is obtainable. Therefore, it is desirable to select the thickness of the metallic nonmagnetic thin layers (Q) between 5 and 50Å.

Value of the MR ratio ΔR/R exhibits, as shown in FIG. 2, oscillations in the RKKY fashion with respect to the change of the thickness of the metallic (Cu in this figure) nonmagnetic thin layers (Q), although it slightly differs depending on the composition of the magnetic thin layers (P) or (P') and the nonmagnetic layers (Q), it takes a first peak in the vicinity of 6–13Å and a second peak in the vicinity of 19–26Å. Therefore, in case a particularly large MR ratio ΔR/R is necessary, the thickness thereof should be selected in the aforementioned ranges of from 6–13Å and 19–26Å.

In the following, the technical advantage of the present invention is explained referring to a concrete example.

EXAMPLE

Using a multi-target spattering apparatus, a metallic artificial lattice film of a configuration shown below was formed on a glass substrate. Hereupon, N represents the total repeating number of depositions and it was changed in a manner that the total film thickness becomes 2000Å.

A: $[Ni—Co—Fe(20)/Cu(20)/Co(20)/Cu(20)]^N$
(numbers in parentheses represent the film thickness in Å) Hereupon, as for the targets, respectively $Ni_{0.8}Co_{0.1}Fe_{0.1}$ (for the magnetic layers (P)), Co (for the magnetic layers (P')), and Cu (for the nonmagnetic metallic layers (Q)) are used and the layer thicknesses were controlled by the opening and closing of respective shutters.

Similarly, using $Ni_{0.8}Co_{0.05}Fe_{0.15}$ (for the magnetic layers (P)), $Co_{0.9}Fe_{0.1}$ (for the magnetic layers (P')), and Cu (for the nonmagnetic metallic layers (Q)) of 80 mm diameter targets, layers B: $[Ni—Co—Fe(30)/Cu(9)]^{N1}$ and
C: $[Co—Fe(40)/Cu(25)]^{N2}$
(numbers in parentheses represent the film thickness in Å) were formed. Hereupon, N1 and N2 represent the total repeating number of depositions, and it was changed in a manner that the total film thickness becomes 2000Å. Applying a patterning process as shown in FIG. 1, the information data readout line S was formed. Next, using an evaporation deposition apparatus, Ni—Fe was evaporation-deposited to form a magnetic film part M, and Cu/Au was evaporation-deposited and the patterning process was performed thereon to form current feed lines R', R. Hereupon, these M, R', R, and S were insulated from each other by respective insulation films, such as $SiO_2$ or SiO thin films, thus the memory element was completed.

Operations of those three different memory elements were checked, which are respectively using artificial lattice magnetoresistance effect films of A, B, and C and fabricated as has been described above. The check showed that they were all found to be capable of issuing outputs of high level from the information data readout line S. The one using B was found to operate with a smallest current for lines R and R' in writing-in action, and those ones using A or C were found to issue particularly large outputs.

Besides the above, it is needless to mention that by the use of a plural number of those above-described elements arranged in a matrix form can realize a large capacity memory.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A memory element comprising:

a magnetic film member which is formed by a patterning process, a read out line for information data readout provided on said magnetic film member in a manner insulated from said magnetic film member, said read out line being made of an artificial lattice magnetoresistance effect film, and a first current feed line and a second current feed line arranged at right angles to each other and in parallel with a plane including said read out line, said first and second current feed lines being insulated from each other and from said magnetic film member and said read out line by insulation layers, said first and second current feed lines performing a writing-data action of the memory element by impressing a magnetic field on said magnetic film member by feeding a first current in said first current feed line and a second current in said second current feed line, said read out line of said artificial lattice magnetoresistance effect film having a structure of an alternate lamination of metallic magnetic layers of a thickness of 5–50Å and metallic nonmagnetic layers of a thickness of 5–50Å.

2. A memory element in accordance with claim 1 wherein said metallic nonmagnetic layers are substantially either one of Cu, Ag, or Au.

3. A memory element in accordance with claim 2 wherein said metallic magnetic layers of said artificial lattice magnetoresistance effect film are of $(Ni_xCo_{1-x})_{x'}Fe_{1-x'}$ as their main composition and x is selected to be in a range of 0.6–1.0 and x' is selected to be in a range of 0.7–1.0.

4. A memory element in accordance with claim 2 wherein said metallic magnetic layers are made of $(Co_yNi_{1-y})_zFe_{-z}$ as their main composition and y is selected to be in a range of 0.4–1.0 and Z is selected to be in a range of 0.8–1.0.

5. A memory element in accordance with claim 3 wherein the thickness of said metallic nonmagnetic layers is 6–13Å.

6. A memory element in accordance with claim 3 wherein the thickness of said metallic nonmagnetic layers is 19–26Å.

7. A memory element in accordance with claim 4 wherein the thickness of said metallic nonmagnetic layers is 6–13Å.

8. A memory element in accordance with claim 4 wherein the thickness of said metallic nonmagnetic layers is 19–26Å.

9. A memory element comprising:

a magnetic film member which is formed by a patterning process, a read out line for information data readout provided on said magnetic film member in a manner insulated from said magnetic film member, said read out line being made of an artificial lattice magnetoresistance effect film, and a first current feed line and a second current feed line arranged at right angles to each other and in parallel with a plane including said read out line, said first and second current feed lines being insulated from each other and from said magnetic film and said read out line by insulation layers, said first and second current feed lines performing a writing-data action of the memory element by impressing a magnetic field on said magnetic film member by feeding a first current in said first current feed line and a second current in said second current feed line, said read out line of said artificial lattice magnetoresistance effect film having a structure of an alternate lamination of first metallic magnetic layers of a thickness of 5–50Å, second metallic magnetic layers of a thickness of 5–50Å and metallic nonmagnetic layers of a thickness of 5–50Å, in a manner to intermediating said metallic nonmagnetic layers therebetween, where said first metallic magnetic layers include $(Ni_xCo_{1-x})_{x'}$, ($0.6 \leq x \leq 1.0$, $0.7 \leq x' \leq 1.0$) as their main composition, said second metallic magnetic layers include $(Co_yNi_{1-y})_{1-z}$ ($0.4 \leq y \leq 1.0$, $0.8 \leq z \leq 1.0$) as their main composition, and the metallic nonmagnetic layers include either one of Cu, Ag, or Au as their main composition.

10. A memory element in accordance with claim 9 wherein the thickness of said metallic nonmagnetic layers is 6–13Å.

11. A memory element in accordance with claim 9 wherein the thickness of said metallic nonmagnetic layers is 19–26Å.

* * * * *